United States Patent
Thacker et al.

(10) Patent No.: US 8,772,920 B2
(45) Date of Patent: Jul. 8, 2014

(54) INTERCONNECTION AND ASSEMBLY OF THREE-DIMENSIONAL CHIP PACKAGES

(75) Inventors: Hiren D. Thacker, San Diego, CA (US); John E. Cunningham, San Diego, CA (US); Ivan Shubin, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 308 days.

(21) Appl. No.: 13/182,220

(22) Filed: Jul. 13, 2011

(65) Prior Publication Data

US 2013/0015578 A1    Jan. 17, 2013

(51) Int. Cl.
*H01L 23/02* (2006.01)

(52) U.S. Cl.
USPC .......... 257/686; 257/777; 257/E33.012; 257/E21.614; 438/109

(58) Field of Classification Search
USPC .......... 257/686, 777, E33.012, E21.614; 438/109
See application file for complete search history.

(56) References Cited

U.S. PATENT DOCUMENTS

| | | | | |
|---|---|---|---|---|
| 5,051,865 A | * | 9/1991 | Kato | 361/718 |
| 6,320,253 B1 | * | 11/2001 | Kinsman et al. | 257/686 |
| 6,376,904 B1 | | 4/2002 | Haba et al. | |
| 6,472,744 B1 | * | 10/2002 | Sato et al. | 257/723 |
| 2009/0321954 A1 | | 12/2009 | Oh | |
| 2011/0057306 A1 | * | 3/2011 | McShane et al. | 257/706 |

FOREIGN PATENT DOCUMENTS

| | | |
|---|---|---|
| EP | 1028463 A1 | 8/2000 |
| EP | 2001036309 | 9/2001 |
| JP | 200136309 A | 9/2001 |
| WO | 9940627 A1 | 8/1999 |

OTHER PUBLICATIONS

O'Reilly, Mike et al., "Jetting Your Way to Fine-pitch 3D Interconnects", Chip Scale Review, Sep./Oct. 2010, pp. 18-21, chipscalereview.com.

Smith, Donald L. et al., "Flip-Chip Bonding on 6-um Pitch using Thin-Film Microspring Technology", Published in Proc. 48th Electronic Components and Technology Conf: Seattle, Washington, May 1998.

(Continued)

*Primary Examiner* — Su Kim
(74) *Attorney, Agent, or Firm* — Park, Vaughan, Fleming & Dowler LLP; Steven E. Stupp

(57) ABSTRACT

In a chip package, semiconductor dies in a vertical stack of semiconductor dies or chips (which is referred to as a 'plank stack') are aligned by positive features that are mechanically coupled to negative features recessed below the surfaces of adjacent semiconductor dies. Moreover, the chip package includes an interposer plate at approximately a right angle to the plank stack, which is electrically coupled to the semiconductor dies along an edge of the plank stack. In particular, electrical pads proximate to a surface of the interposer plate (which are along a stacking direction of the plank stack) are electrically coupled to pads that are proximate to edges of the semiconductor dies by an intervening conductive material, such as solder balls or spring connectors. Note that the chip package may facilitate high-bandwidth communication of signals between the semiconductor dies and the interposer plate.

20 Claims, 12 Drawing Sheets

(56) References Cited

OTHER PUBLICATIONS

Saito, Mitsuko et al., "A 2Gb/s 1.8pJ/b/chip Inductive-Coupling Through-Chip Bus for 128-Die NAND-Flash Memory Stacking", ISSCC 2010 / Session 24/ Dram & Flash Memories / 24.5, 2010, pp. 440-442.

Kang, Uksong et al., "8 Gb 3-D DDR3 Dram Using Through-Silicon-Via Technology", IEEE Journal of Solid-State Circuits, vol. 45, No. 1, Jan. 2010, pp. 111-119.

Schuylenbergh, Koenraad Van et al., "On-Chip Out-of-Plane High-Q Inductors", IEEE 2002, pp. 364-373.

* cited by examiner

INTERCONNECTION AND ASSEMBLY OF THREE-DIMENSIONAL CHIP PACKAGES

CROSS REFERENCE TO RELATED APPLICATION

This application is related to U.S. Non-provisional patent application Ser. No. 13/029,825, entitled "Chip Package with Plank Stack of Semiconductor Dies," by Darko R. Popovic, Matthew D. Giere, Bruce M. Guenin, Theresa Y. Sze, Ivan Shubin, John A. Harada, David C. Douglas and Jing Shi, filed on Feb. 17, 2011, the contents of which are herein incorporated by reference.

BACKGROUND

1. Field

The present disclosure generally relates to the design of chip packages. More specifically, the present disclosure relates to a chip package that includes: a group of semiconductor dies arranged in a plank stack, an interposer plate oriented approximately at a right angle relative to the plank stack, and associated alignment features.

2. Related Art

The ability to provide low-latency and high-bandwidth access between a processor and memory remains a significant challenge in computer systems. To achieve the former, system designers are using packaging innovations to reduce the electrical path length between the processor and memory. For example, the processor and memory are now often implemented on a common package or interposer (as opposed to conventional individually packaged chips that are connected to a printed circuit board). Researchers are also attempting to stack memory chips directly onto a processor die. Moreover, in order to obtain a higher memory density per unit volume, several memory manufacturers are attempting to stack memory chips in the third dimension.

Chip packages that include stacked semiconductor chips can provide significantly higher performance in comparison to existing computer systems. These chip packages also provide certain advantages, such as the ability: to use different processes to fabricate different chips in the stack, to combine higher density logic and memory, and to transfer data using less power. For example, a stack of chips that implements a dynamic random-access memory (DRAM) can use a high metal-layer-count, high-performance logic process in a base chip to implement input/output (I/O) and controller functions, and a set of lower metal-layer-count, DRAM-specialized process chips can be used for the rest of the stack. In this way, the combined set of chips may have better performance and lower cost than: a single chip that includes the I/O and controller functions manufactured using the DRAM process; a single chip that includes memory circuits manufactured using a logic process; or a system constructed by attempting to use a single process to make both logic and memory physical structures.

However, integrating even one memory chip onto a processor or an application-specific integrated circuit (ASIC) can be difficult. Typically, face-to-face integration is not used because this configuration can block access to power/ground and signal I/O lines for the processor. On the other hand, stacking the memory chip(s) on the back face of the processor typically involves the use of through-silicon-vias (TSVs) in the processor. In a TSV fabrication technique, chips are processed so that one or more of the metal layers on their active face are conductively connected to new pads on their back face. Then, chips are adhesively connected in a stack, so that the new pads on the back face of one chip make conductive contact with corresponding pads on the active face of an adjacent chip.

TSVs are typically more expensive than existing interconnect techniques (such as wire bonds), because TSVs pass through the active silicon layer of a chip. As a consequence, a TSV occupies area that could have been used for transistors or wiring. This opportunity cost can be large. For example, if the TSV exclusion or keep-out diameter is 20 μm, and TSVs are placed on a 30-μm pitch, then approximately 45% of the silicon area is consumed by the TSVs. This roughly doubles the cost per area for any circuits in the chips in the stack. (In fact, the overhead is likely to be even larger because circuits are typically spread out to accommodate TSVs, which wastes more area.) Furthermore, fabricating TSVs usually entails additional processing operations and yield loss, which also increase cost. In addition, TSVs occupy the surface traditionally used for cooling, which usually presents a significant challenge for thermal management, and thus often limits the number of stacked semiconductor dies.

Hence, what is needed is a chip package that offers the advantages of stacked semiconductor dies without the problems described above.

SUMMARY

One embodiment of the present disclosure provides a chip package. This chip package includes a group of semiconductor dies arranged in a plank stack in an x direction (which is sometimes referred to as a 'stacking direction'), where a plane of a given semiconductor die is defined by a z direction and a y direction, where the z direction, the x direction and the y direction are substantially perpendicular to each other. Note that the semiconductor dies include first electrical pads proximate to edges of the semiconductor dies, and the edges of the semiconductor dies define a face of the plank stack. Moreover, surfaces of the semiconductor dies include negative features recessed below the surfaces. The chip package also includes positive features mechanically coupled to the negative features on adjacent semiconductor dies, thereby aligning the semiconductor dies in the plank stack. Furthermore, the chip package includes an interposer plate electrically coupled to the semiconductor dies along the x direction, where a plane of the interposer plate is defined by the x direction and the y direction. This electrical coupling to the semiconductor dies is between the first electrical pads, second electrical pads proximate to a surface of the interposer plate along the x direction, and an intervening conductive material between the first electrical pads and the second electrical pads.

Note that a first electrical pad on a given semiconductor die may be included in another negative feature recessed below one of the surfaces of the given semiconductor die. This other negative feature may be included in a dicing lane of the given semiconductor die.

Moreover, the intervening conductive material may include solder balls. Furthermore, the edges of the semiconductor dies may be surrounded by the solder balls. Alternatively, in some embodiments the intervening conductive material includes mechanically compliant electrical connectors, such as an array of spring connectors. Note that surfaces of a given semiconductor die may be positioned between and mechanically coupled to at least a pair of spring connectors in the array of spring connectors.

Additionally, a first electrical pad on a given semiconductor die may be electrically coupled to an additional pad on the given semiconductor die by an electrical signal line.

In some embodiments, the chip package includes a mechanical-alignment plate and mechanical-alignment components, where the plank stack is mechanically coupled to the mechanical-alignment plate by the mechanical-alignment components, thereby facilitating alignment of the semiconductor dies in the plank stack. Moreover, the mechanical-alignment plate may be mechanically coupled to the plank stack on an opposite face of the plank stack from the interposer plate. For example, the mechanical-alignment components may include: spheres, clamps and/or pins.

In some embodiments, the semiconductor dies include third electrical pads proximate to the edges of the semiconductor dies along the y direction, and the interposer plate is electrically coupled to the semiconductor dies along the y direction. This electrical coupling to the semiconductor dies may be between the third electrical pads, fourth electrical pads proximate to the surface of the interposer plate along the y direction, and the intervening conductive material between the third electrical pads and the fourth electrical pads.

Note that the second electrical pads may include discrete pads and/or a continuous electrical signal line on the interposer plate. Moreover, the interposer plate may include: a semiconductor die, a ceramic, an organic material and/or glass.

In some embodiments, the semiconductor dies are mechanically coupled by adhesive layers in spaces between the semiconductor dies. These adhesive layers may be recessed from the first electrical pads in the spaces between pairs of semiconductor dies.

Moreover, in some embodiments additional mechanical-alignment components are mechanically coupled to the edges of the semiconductor dies and the interposer plate.

Another embodiment provides a system (such as an electronic device and/or a computer system) that includes the chip package.

Another embodiment provides a method for fabricating the plank stack of semiconductor dies in an x direction. During this method, the semiconductor dies are stacked along the x direction into the plank stack, where the plane of the given semiconductor die is defined by the z direction and the y direction, where the z direction, the x direction and the y direction are substantially perpendicular to each other. Note that the semiconductor dies include the first electrical pads proximate to edges of the semiconductor dies, and the edges of the semiconductor dies define the face of the plank stack. Moreover, the surfaces of the semiconductor dies may include the negative features recessed below the surfaces. While stacking the semiconductor dies, the semiconductor dies in the plank stack are aligned by mechanically coupling positive features to the negative features on adjacent semiconductor dies. Furthermore, the interposer plate may be electrically coupled to the semiconductor dies along the x direction, where the plane of the interposer plate is defined by the x direction and the y direction. The electrical coupling to the semiconductor dies may be between the first electrical pads, second electrical pads proximate to the surface of the interposer plate along the x direction, and the intervening conductive material between the first electrical pads and the second electrical pads.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a chip package, a system that includes the chip package, and a method for fabricating a plank stack of semiconductor dies in the chip package are described. In this chip package, semiconductor dies in a vertical stack of semiconductor dies or chips (which is referred to as a 'plank stack') are aligned by positive features that are mechanically coupled to negative features recessed below the surfaces of adjacent semiconductor dies. Moreover, the chip package includes an interposer plate at approximately a right angle to the plank stack, which is electrically coupled to the semiconductor dies along an edge of the plank stack. In particular, electrical pads proximate to a surface of the interposer plate (which are along a stacking direction of the plank stack) are electrically coupled to pads that are proximate to edges of the semiconductor dies by an intervening conductive material, such as solder balls or spring connectors. Note that the chip package may facilitate high-bandwidth communication of signals between the semiconductor dies and the interposer plate.

This chip-stacking technique may facilitate improved three-dimensional (3D) stacks of semiconductor dies relative to existing techniques (such as through-silicon vias or TSVs, wire bonding, etc.). In particular, by using positive and negative features to facilitate alignment and assembly, the resulting plank stack may accommodate a significantly larger number of semiconductor dies (several tens) than existing chip packages. Moreover, by removing the need for costly and area-consuming TSVs in the semiconductor dies, the cost of the chip package may be reduced. For example, the cost may be reduced by avoiding the processing operations and the wasted area associated with TSVs in the semiconductor dies. Thus, the chips in the plank stack may be fabricated using standard processing (such as CMOS-compatible processing). Furthermore, the approximately perpendicular configuration of the semiconductor dies and the interposer plate may increase the density and may offer improved thermal management unconstrained by the number of semiconductor dies. Note that the interposer plate can offer a first-level interconnect with a higher inter-component communication bandwidth and reduced latency than wire bonding, and can have comparable communication bandwidth and latency to those offered by semiconductor dies that include TSVs. In addition, the chip-stacking technique may facilitate direct and simultaneous access to each semiconductor die in the plank stack. Consequently, the chip package can facilitate low-cost, low-latency, low-power and/or high-performance 3D stacks of semiconductor dies.

Figure 1:
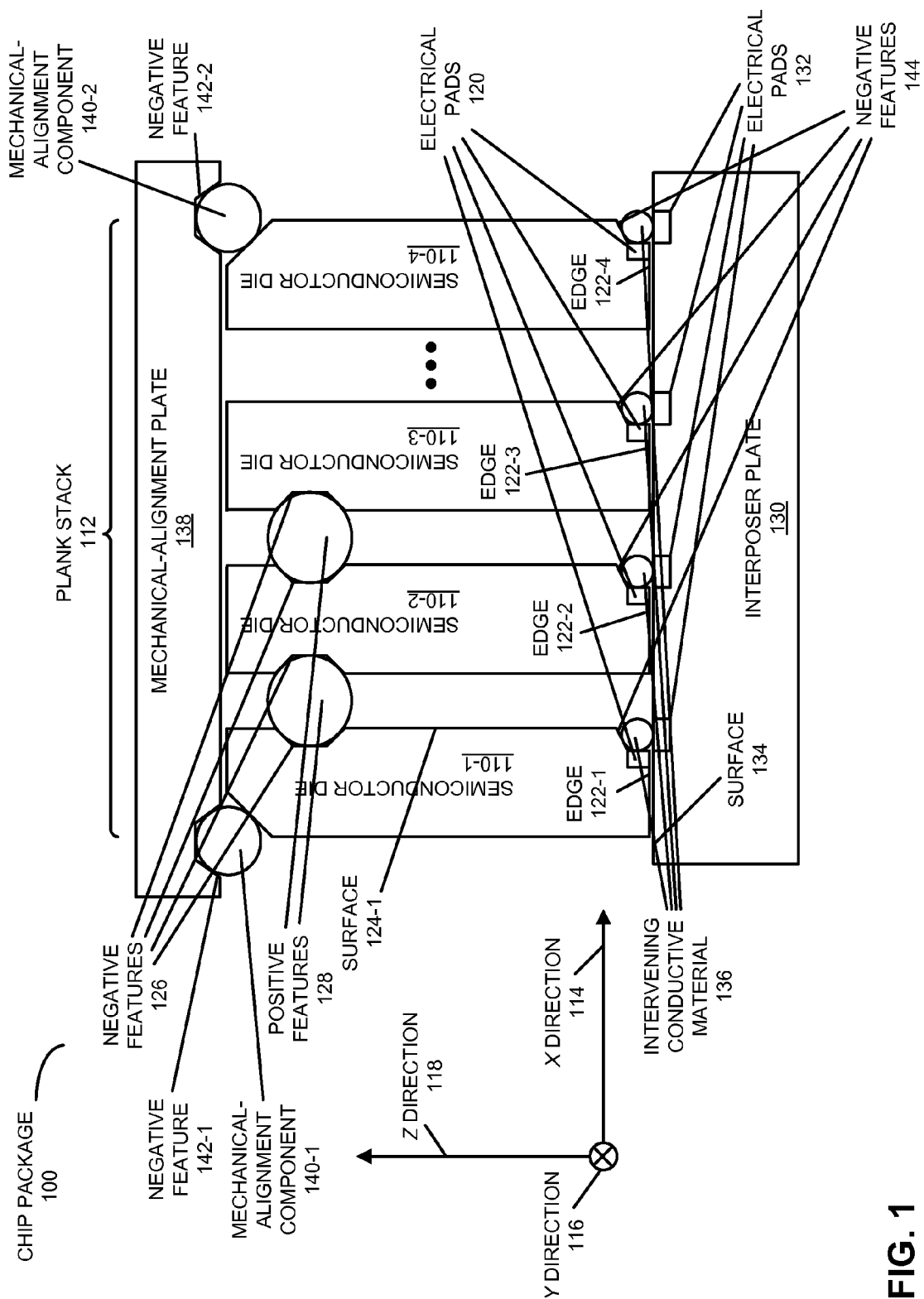
FIG. 1 is a block diagram illustrating a side view of a chip package in accordance with an embodiment of the present disclosure.

We now describe embodiments of the chip package. FIG. 1 presents a block diagram illustrating a side view of a chip package 100. This chip package includes a group of semiconductor dies 110 (which are sometimes referred to as 'chips') arranged in a plank stack 112 in an x direction 114 (which is sometimes referred to as a 'stacking direction'), where a plane of a given semiconductor die is defined by a y direction 116 (which is into the plane of FIG. 1) and a z direction 118, and z direction 118, x direction 114 and y direction 116 are substantially perpendicular to each other. Note that semiconductor dies 110 include electrical pads 120 proximate to edges 122 of semiconductor dies 110, and edges 122 of semiconductor dies 110 define a face of plank stack 112. For example, electrical pads 120 may be deposited onto the active electronics. These pads can be implemented using either the semiconductor-die layout or a redistribution layer (RDL). In some embodiments, electrical pads 120 have a uniform inter-pad spacing. However, in other embodiments a non-uniform spacing is used.

Moreover, surfaces of semiconductor dies 110 (such as surface 124-1) may include negative features 126 recessed below surfaces. Chip package 100 also includes positive features 128 mechanically coupled to negative features 126 on adjacent semiconductor dies. These positive and negative features may constitute a self-alignment mechanism that aligns semiconductor dies 110 in plank stack 112.

Chip package 100 may include an interposer plate 130 (which is sometimes referred to as a 'substrate' or a 'semiconductor base chip') that may be rigidly mechanically and electrically coupled to semiconductor dies 110 along x direction 114 (i.e., to the face of plank stack 112), where a plane of interposer plate 130 is defined by x direction 114 and y direction 116. This electrical coupling to semiconductor dies 110 may be between: electrical pads 120, electrical pads 132 (which are proximate to a surface 134 of interposer plate 130 along x direction 114) and an intervening conductive material 136 (such as solder balls) between electrical pads 120 and electrical pads 132. For example, the electrical coupling may include edge connectors between electrical pads 120 and electrical pads 132. Note that the electrical coupling may facilitate input/output (I/O) communication with semiconductor dies 110 and/or supplying power to semiconductor dies 110. In some embodiments, chip package 100 facilitates simultaneous communication with each of a large number of semiconductor dies 110 while maintaining a small overall footprint.

While FIG. 1 illustrates electrical coupling between semiconductor dies 110 and interposer plate 130 along x direction 114, in some embodiments electrical pads 120 are also arranged along y direction 116 (i.e., electrical pads are arranged along an edge of semiconductor dies 110 in the plane of semiconductor dies 110), and electrical coupling between semiconductor dies 110 and interposer plate 130 also occurs along y direction 116 via intervening conductive material 136. In embodiments where semiconductor dies 110 are other than memory chips, the electrical pads 120 along y direction 116 for a given semiconductor die (such as semiconductor die 110-1) may be discrete or a continuous electrical signal line (such as a bus). Thus, the electrical coupling along y direction 116 may involve simultaneous one-to-one electrical connections or a bus. Similarly, the electrical coupling along x direction 114 may involve simultaneous one-to-one electrical connections or a bus. (Thus, electrical pads 132 may include discrete pads and/or a continuous electrical signal line on interposer plate 130).

In an exemplary embodiment, interposer plate 130 includes: a semiconductor die (such as silicon), a ceramic, an organic material and/or glass. Moreover, intervening conductive material 136 may include: solder balls (such as a compound or stoichiometry of tin-lead, tin-silver-copper, indium, etc.), which is further illustrated below with reference to FIGS. 4-6 and 11; stacked solder balls; partially ground conductive material having a modified aspect ratio compared with that of unground conductive material; stud bumps; copper pillars; plated traces; wire bonds; mechanically compliant electrical connectors, such as spring connectors, which are implemented on semiconductor dies 110 and/or interposer plate 130 (as illustrated below with reference to FIGS. 7-10 and 12); traces defined using tape automated bonding (TAB); an anisotropic conductive material that includes silver, copper and/or tin particles in one or more polymer binders (such as an anisotropic elastomer film, which is sometimes referred to as an 'anisotropic conductive film'); and/or a conductive adhesive.

In some embodiments, chip package 100 includes a mechanical-alignment plate 138 (such as a micromachined component) and mechanical-alignment components 140, where plank stack 112 is mechanically coupled to mechanical-alignment plate 138 by mechanical-alignment components 140 that are positioned in negative features 142 (such as etch pits). Mechanical-alignment plate 138 may provide an external clamping mechanism that holds plank stack 112 together, thereby facilitating alignment of semiconductor dies 110 in plank stack 112. Note that mechanical-alignment components 140 may include: spheres (such as sapphire alignment balls, which may be held in place by an adhesive), clamps and/or pins. Moreover, mechanical-alignment plate 138 may be mechanically coupled to plank stack 112 on an opposite face of plank stack 112 from interposer plate 130.

Figure 4:
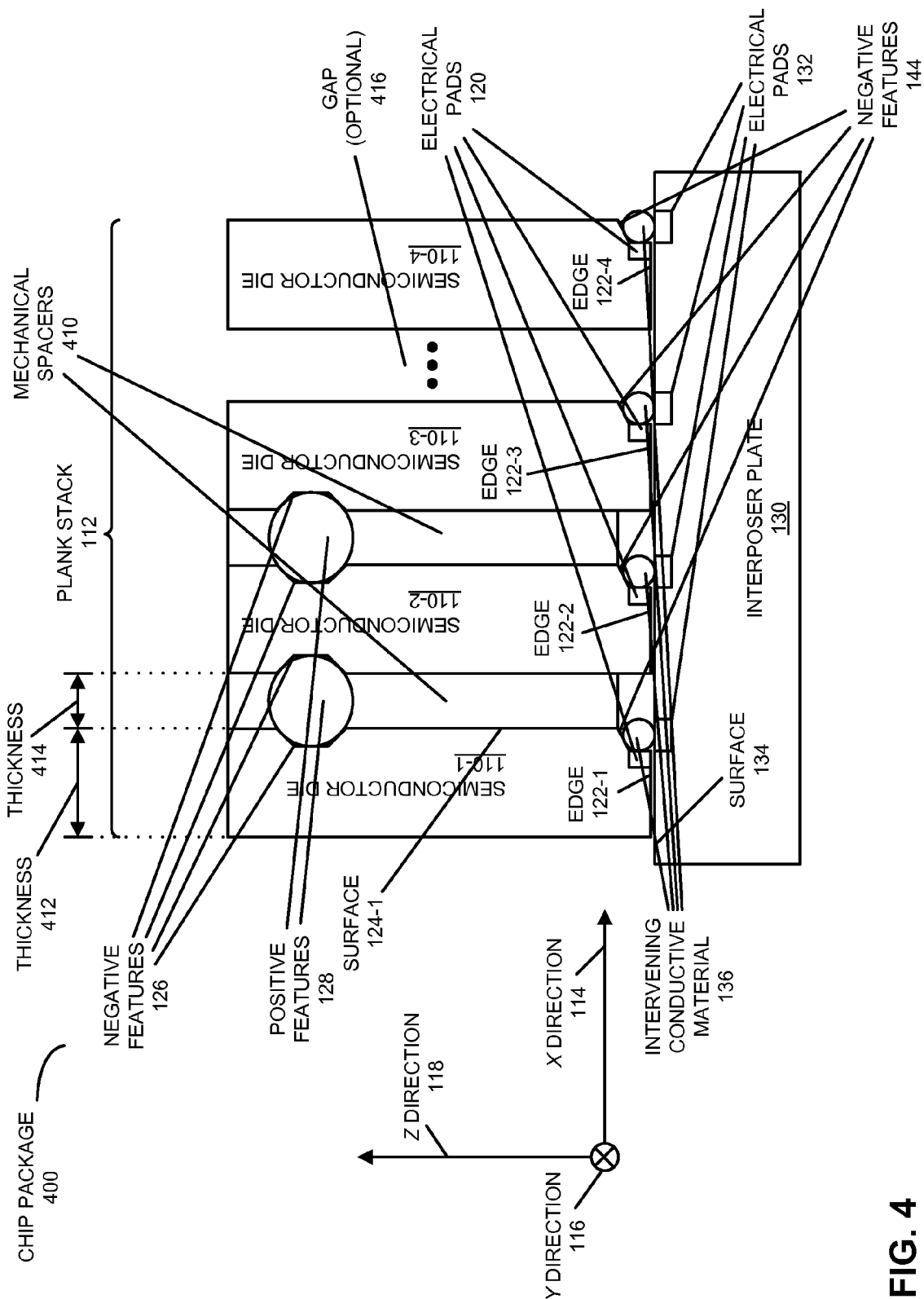
FIG. 4 is a block diagram illustrating a side view of a chip package in accordance with an embodiment of the present disclosure.

Using negative features 126, positive features 128, mechanical-alignment plate 138 and/or mechanical-alignment components 140, the accumulated position errors over the group of semiconductor dies 110 in x direction 114 (i.e., an accumulated position error in positions of semiconductor dies 110 over plank stack 112) may be less than a sum of the position errors associated with the group of semiconductor dies 110 and an optional mechanical spacer between semiconductor dies (which is described further below with reference to FIG. 4). For example, the accumulated position error may be associated with thickness variation of the semiconductor dies 110 and/or thickness variation of the optional mechanical spacer. In some embodiments, the accumulated position error may be less than 1 μm, and may be as small as 0 μm. Additionally, the group of semiconductor dies 110 may have a maximum position error in the plane of semiconductor dies 110 that is associated with edge variation of semiconductor dies 110 (such as a variation in the saw-line position), that is less than a predefined value (for example, the maximum position error may be less than 1 μm, and may be as small as 0 μm).

Figure 2:
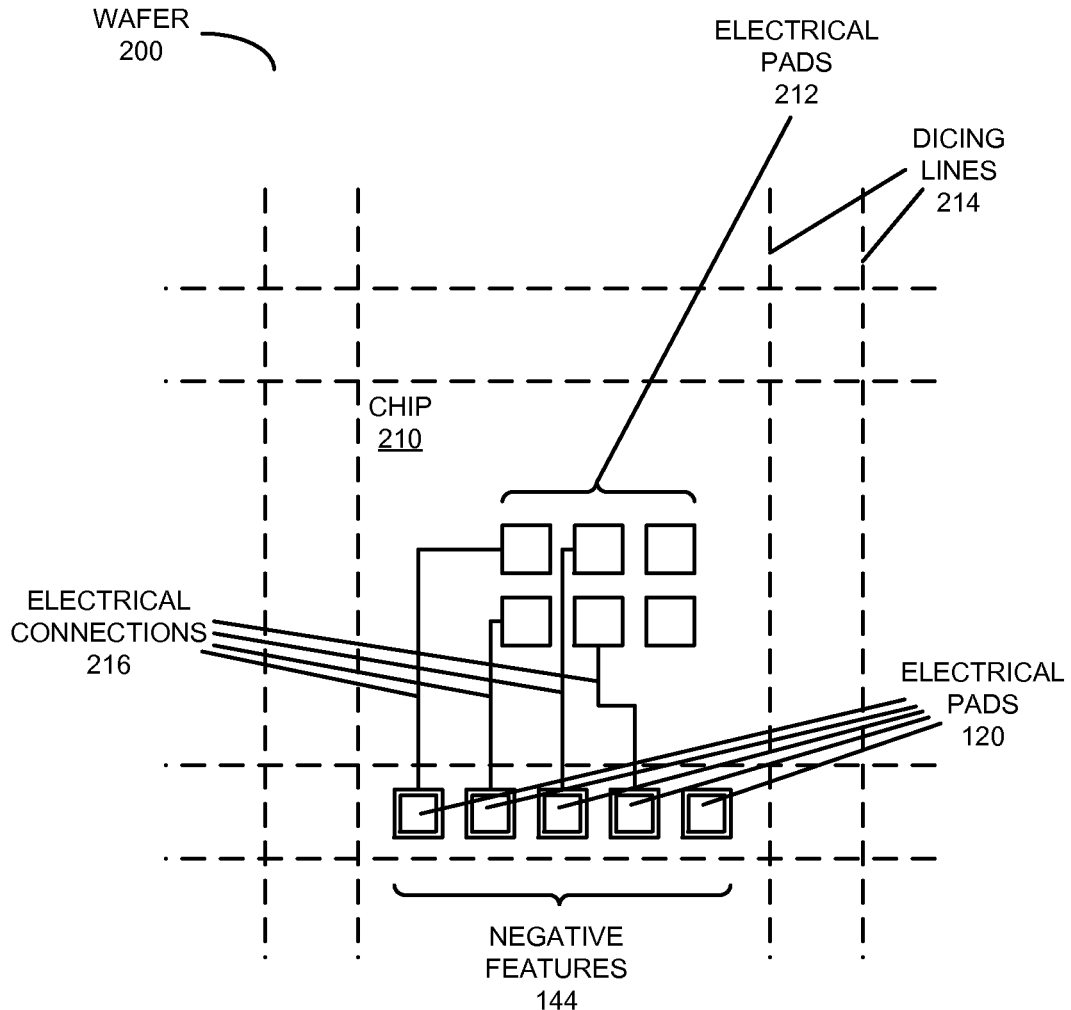
FIG. 2 is a block diagram illustrating a top view of a chip in a wafer in accordance with an embodiment of the present disclosure.

Note that electrical pads 120 on a given semiconductor die may be included in negative features 144 recessed below one of the surfaces of the given semiconductor die. These negative features may be included in a dicing lane of the given semiconductor die. This is illustrated in FIG. 2, which presents a block diagram illustrating a top view of a chip 210 in a wafer 200. This chip includes electrical pads 212 (such as I/O pads). Moreover, wafer 200 includes negative features 144 (such as etch pits) in dicing lanes (which are sometimes referred to as 'saw lanes'), such as a dicing lane defined by dicing lines 214. Note that dicing lanes are regions between chips on wafer 200 that are reserved for the dicing process (during which wafer 200 is cut up and singulated into individual semiconductor dies or chips).

After negative features 144 are fabricated, metal electrical connections 216 (which are sometimes referred to as 'traces' or 'signal lines') to electrical pads 212 may be fabricated on chip 210. Note that electrical connections 216 may electrically couple electrical pads 212 to edge connectors, such as electrical pads 120, in negative features 144 (e.g., to at least a single array of metallized etch pits, which may be used for signal redistribution). Furthermore, electrical connections 216 may be implemented in the RDL (which, along with electrical pads 120, may be fabricated using one or more post-processing operations). Thus, using this fabrication technique, I/O pads on the top face of chip 210 may be translated to a single linear array along the chip edge. Moreover, the operations used during the fabrication technique (such as pit etching, pit metallization, and redistribution wiring) can be performed at wafer scale, thereby capitalizing on the cost advantages of wafer-level batch processing. Based on this discussion, note that negative features 144 may facilitate mechanical and edge electrical coupling to interposer plate 130 (FIG. 1).

Figure 3A:
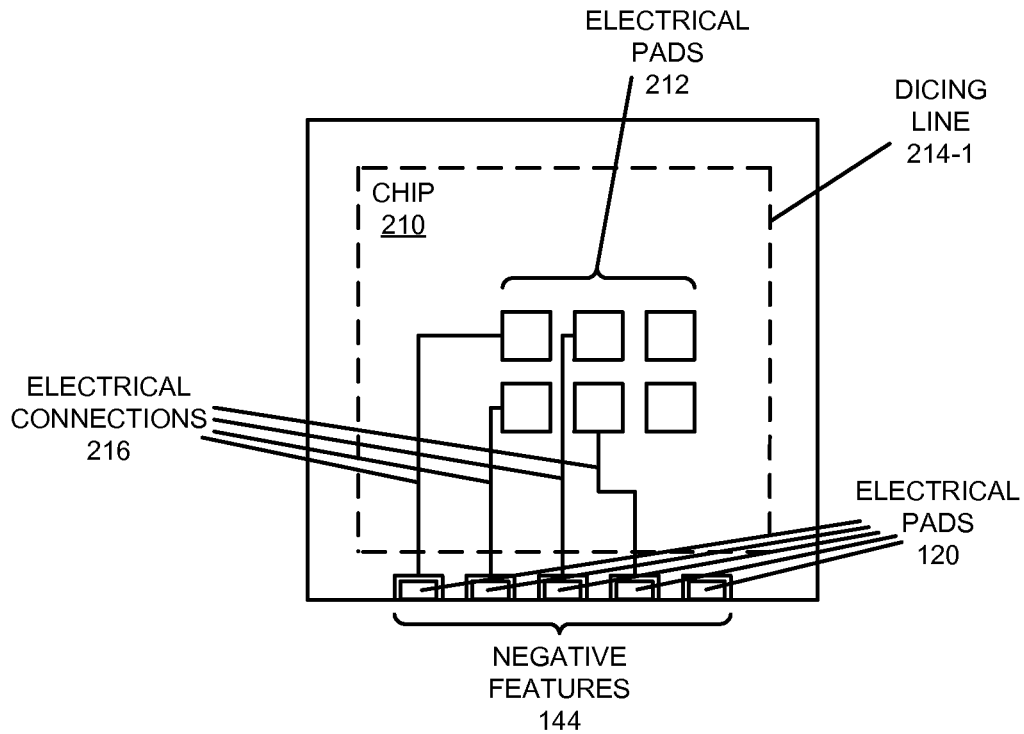
FIG. 3A is a block diagram illustrating a top view of the chip in FIG. 2 after dicing in accordance with an embodiment of the present disclosure.

During the dicing process, a cut is made through the etched and metallized pit arrays (e.g., by blade dicing or laser ablation). The singulation process can be performed using the typical dicing-variation tolerances so that only the flat bottom of negative features 144 is left exposed to yield a partial pit structure as shown in FIG. 3A, which presents a block diagram illustrating a top view of chip 210 after dicing.

Figure 3B:
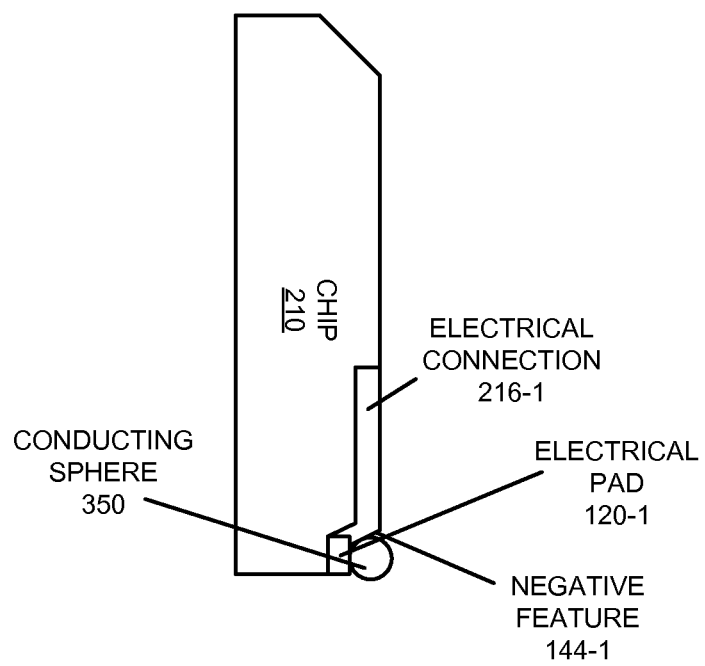
FIG. 3B is a block diagram illustrating a side view of the chip in FIG. 2 after dicing in accordance with an embodiment of the present disclosure.

Moreover, after dicing, spheres coated with a reflowable material (such as solder) and, more generally, intervening conductive material 136 in FIG. 1 may be placed in negative features 144. This is illustrated in FIG. 3B, which presents a block diagram illustrating a side view of chip 210 (after dicing) and conductive sphere 350. Note that conductive sphere 350 may be held in place or attached to the partial etch pit at the edge of the diced chip using glue or an adhesive. Alternatively, the reflowable material may be reflowed.

Note that, because the electrical coupling between the plank stack and the interposer plate can use a reflow process, the dicing, chip placement and/or chip pitch may not need to be highly precise, so long as the cumulative position error is smaller than the maximum allowable offset for the reflow electrical coupling to be made between the semiconductor dies and the interposer plate.

Assembly of a chip package involves building up a plank stack with the desired number of chips or semiconductor dies, followed by assembling the plank stack onto a package substrate or printed circuit board (and, more generally, an interposer plate). A variety of techniques may be used to stack the semiconductor dies. Because the goal is to assemble the plank stack along an edge, during the stacking process the semiconductor dies typically have a separation or pitch that is approximately equal to the pitch of the matching arrays of electrical pads on the interposer plate (each of which corresponds to a given semiconductor die in the plank stack).

One technique for assembling the plank stack is to use a non-conductive mechanical spacer (such as an adhesive) between the semiconductor dies. For example, the semiconductor dies can be positioned using pick and place equipment, and the adhesive may be dispensed in liquid form or as precut sheets of adhesive tape. FIG. 4 presents a block diagram illustrating a side view of a chip package 400. This chip package includes mechanical spacers 410 in the spaces between pairs of semiconductor dies (such as semiconductor dies 110-1 and 110-2) in group of semiconductor dies 110. For example, semiconductor dies 110 in plank stack 112 may be mechanically coupled to each other by adhesive layers, such as an epoxy or glue that cures in 10 s at 140 C. (Alternatively, mechanical spacers 410 may be air.) Note that the adhesive layers may be recessed from electrical pads 120 in negative features 144. Moreover, if an adhesive is used in mechanical spacers 410, mechanical-alignment plate 138 (FIG. 1) and mechanical-alignment components 140 (FIG. 1) may not be needed.

A given semiconductor die in the group of semiconductor dies 110 may have a nominal thickness, such as thickness 412 (which may be between 30 and 250 μm), and mechanical spacers 410 may have a nominal thickness, such as thickness 414 (which may be between 10 and 600 μm). However, note that in some embodiments the thickness of at least some of semiconductor dies 110 and/or mechanical spacers 410 in plank stack 112 may be different (for example, thicknesses of semiconductor dies 110 and/or mechanical spacers 410 may vary along x direction 114).

Furthermore, spacing between semiconductor dies 110 in plank stack 112 may need to be controlled to ensure reliable electrical coupling to interposer plate 130. Controlled spacing between semiconductor dies 110 can be achieved using spacer bumps (which may be wider and taller than the solder or stud bumps in intervening conductive material 136).

In some embodiments, the group of semiconductor dies 110 may include at least two optional subsets of semiconductor dies, each of which includes at least two semiconductor dies 110. These optional subsets of semiconductor dies (which are sometimes referred to as 'sub-stacks') may be combined to form the full plank stack 112. Moreover, optional subsets of semiconductor dies may be separated by an optional gap 416 along x direction 114. This gap may be used during the assembly process to improve the alignment accuracy and/or improve the alignment in chip package 400 even in the presence of thermal expansion. Additionally, testing/screening of optional sub-stacks can be performed in order to improve the overall yield of chip package 400 (for example, testing of semiconductor dies 110 and/or plank stack 112 may be performed prior to assembly of chip package 400).

In general, packaging techniques that allow some rework are more cost-effective when faced with lower semiconductor-die yields or high expense to test extensively before packaging and assembly. Therefore, in embodiments where the mechanical and/or electrical coupling between semiconductor dies 110 and interposer plate 130 is remateable, the yield of the chip package may be increased by allowing rework (such as replacing a bad chip that is identified during assembly, testing or burn-in). In this regard, remateable mechanical or electrical coupling should be understood to be mechanical or electrical coupling that can be established and broken repeatedly (i.e., two or more times) without requiring rework or heating (such as with solder).

Referring back to FIG. 1, a remateable plank stack 112 may be implemented using non-metallized negative features 126 (which are used for alignment and stacking purposes) at the cost of fabricating etching pits on the back side of semiconductor dies 110. Moreover, positive features 128 may include polystyrene spheres, which may facilitate a remateable plank stack 112 without negative features 126. Alternatively or additionally, the remateable mechanical or electrical coupling may involve male and female components designed to couple to each other (such as components that snap together).

Figure 5:
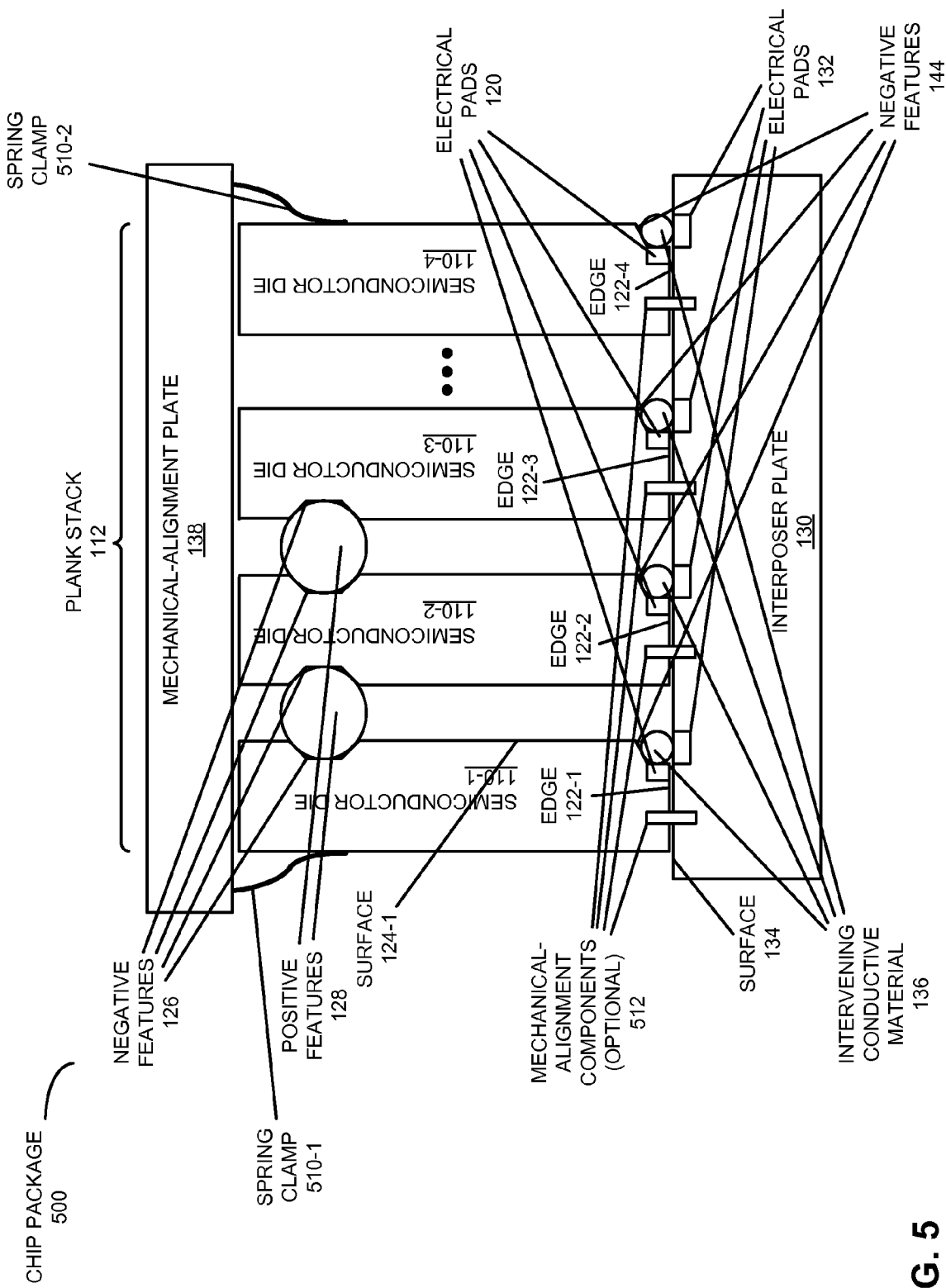
FIG. 5 is a block diagram illustrating a side view of a chip package in accordance with an embodiment of the present disclosure.

While the preceding embodiments illustrated mechanical-alignment components 140 as spheres or balls, in other embodiments mechanical-alignment plate 138 includes spring clamps that extend vertically from the surface and exert a horizontal force (thereby facilitating a remateable plank stack). This is illustrated in FIG. 5, which presents a block diagram illustrating a side view of a chip package 500 with spring clamps 510 providing a horizontal compressive force that helps hold plank stack 112 together.

In some embodiments, subassembly of the plank stack and electrical coupling to the interposer plate involves a reflow process. In particular, during the reflow process, the reflowable material on the conducting spheres in the etch pits (and, more generally, intervening conductive material 136 in negative features 144) reflows and forms electrical and mechanical coupling to the electrical pads 132.

Figure 6:
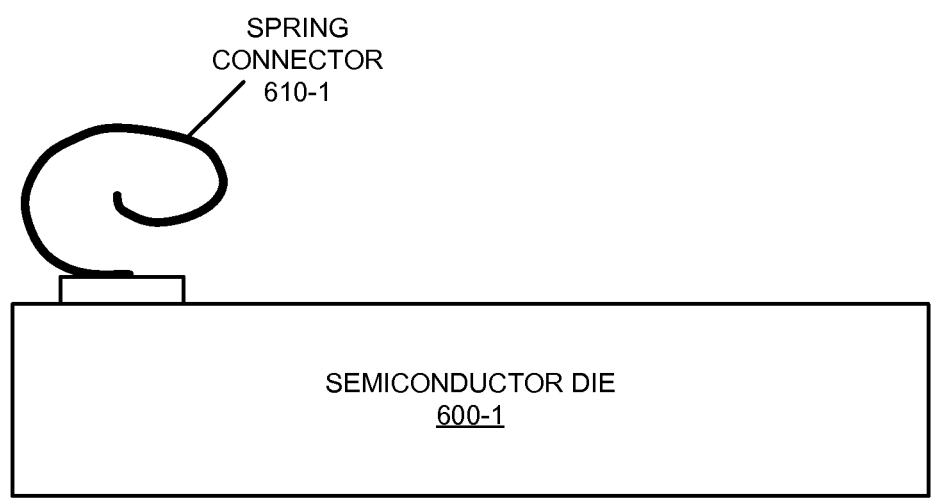
FIG. 6 is a block diagram illustrating a side view of a semiconductor die with spring connectors in accordance with an embodiment of the present disclosure.

However, in some embodiments the chip package is post-processed to fabricate mechanically compliant electrical connections, such as spring connectors, attached to electrical pads 120 along one of the edges of plank stack 112. These edge connectors and the spring connectors can be implemented in an RDL process (i.e., a wafer-scale process). This is illustrated in FIG. 6, which presents a block diagram illustrating a side view of a semiconductor die 600-1 with spring connector 610-1. This spring connector may include stress-engineered metal electrical connectors that can be designed to have a particular elevation above the surface of semiconductor die 600-1, and to have a coil structure. Consequently, when semiconductor die 600-1 is brought in contact with the surface of the interposer plate, spring connector 610-1 may provide a specified degree of mechanical compliance.

Figure 7:
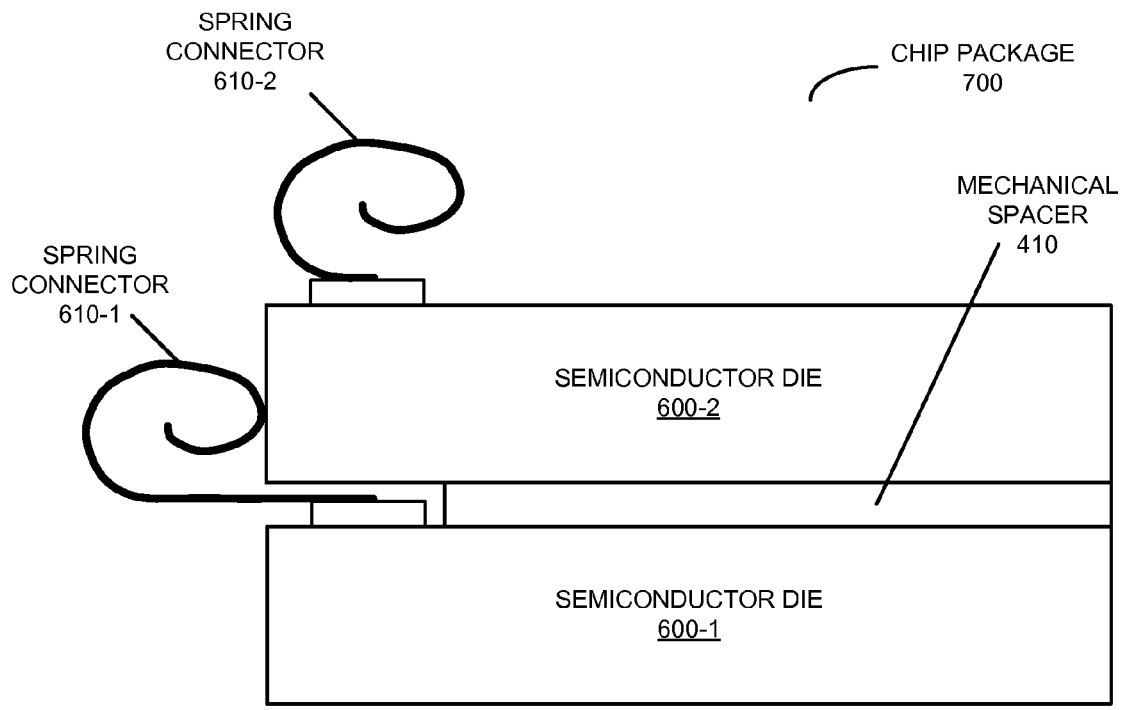
FIG. 7 is a block diagram illustrating a side view of assembly of a chip package that includes semiconductor dies with spring connectors in accordance with an embodiment of the present disclosure.

In this assembly technique, two singulated chips with spring connectors may be oriented so that the edges with the spring connectors are parallel to each other. The edge of the top chip may be forced against the one or more coiled spring connectors on the bottom chip, and the edge of the top chip may be used to unroll a portion of the coiled spring connector on the bottom chip, thereby extending the spring connectors outside the perimeter of the bottom chip. This is illustrated in FIG. 7, which presents a block diagram illustrating a side view of assembly of a chip package 700 that includes semiconductor dies 600 with spring connectors 610.

Figure 8:
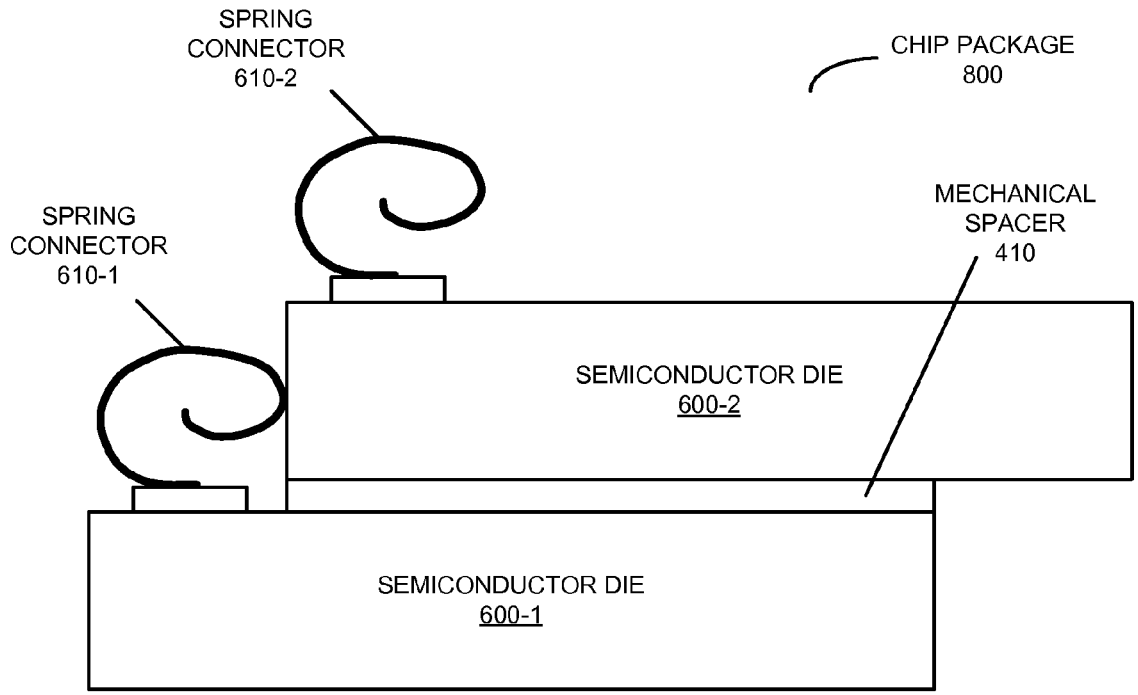
FIG. 8 is a block diagram illustrating a side view of assembly of a chip package that includes semiconductor dies with spring connectors in accordance with an embodiment of the present disclosure.

Alternatively, two semiconductor dies in a plank stack may be assembled with a predefined lateral gap or offset between their edges. This is shown in FIG. 8, which presents a block diagram illustrating a side view of assembly of a chip package 800 that includes semiconductor dies 600 with spring connectors 610.

Figure 9:
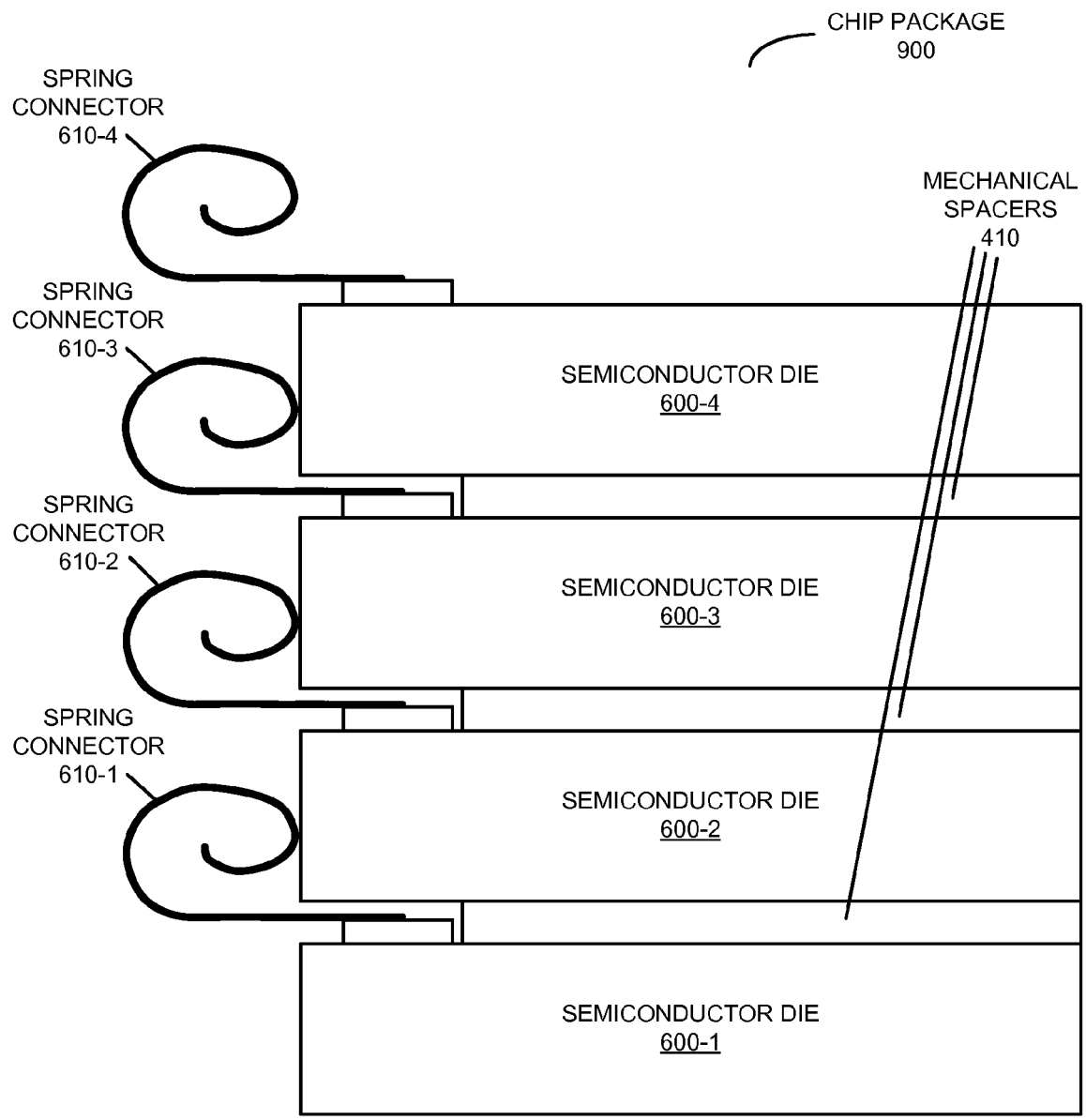
FIG. 9 is a block diagram illustrating a side view of a chip package that includes semiconductor dies with spring connectors in accordance with an embodiment of the present disclosure.

After attachment of the first two semiconductor dies, the operations in this process may be repeated a number of times to build up the desired number of chips in the plank stack. This is shown in FIG. 9, which presents a block diagram illustrating a side view of a chip package 900 that includes semiconductor dies 600 with spring connectors 610. Note that several tens of chips having a specified thickness can be stacked together using one of these assembly techniques to fabricate an edge-accessible plank stack. Note that the spring connectors may be designed to have one or several turns. As is known to one of skill in the art, design parameters of spring connectors 610, such as the diameter of the coil, thickness of the coil, width of the coil, number of turns, effective spring constant, etc., may be independently determined depending on the particular geometry and application.

Note that a chip package that includes chips that are stacked with a lateral gap between their edges may be angled with respect to the surface of the interposer plate so that the edge with the spring connectors is approximately parallel to the surface. Because of the flexibility and mechanical compliance provided by the spring connectors, the resulting stacked interconnect may address problems associated with dicing tolerances (e.g., when there are variations in the chip width and/or length) and chip-to-chip placement errors. Moreover, the bond-line thickness between the chips may be minimized relative to one other. These assembly techniques may allow for either a more compact vertically stacked plank stack or a thicker plank stack (which may offer improved thermal performance).

Figure 10:
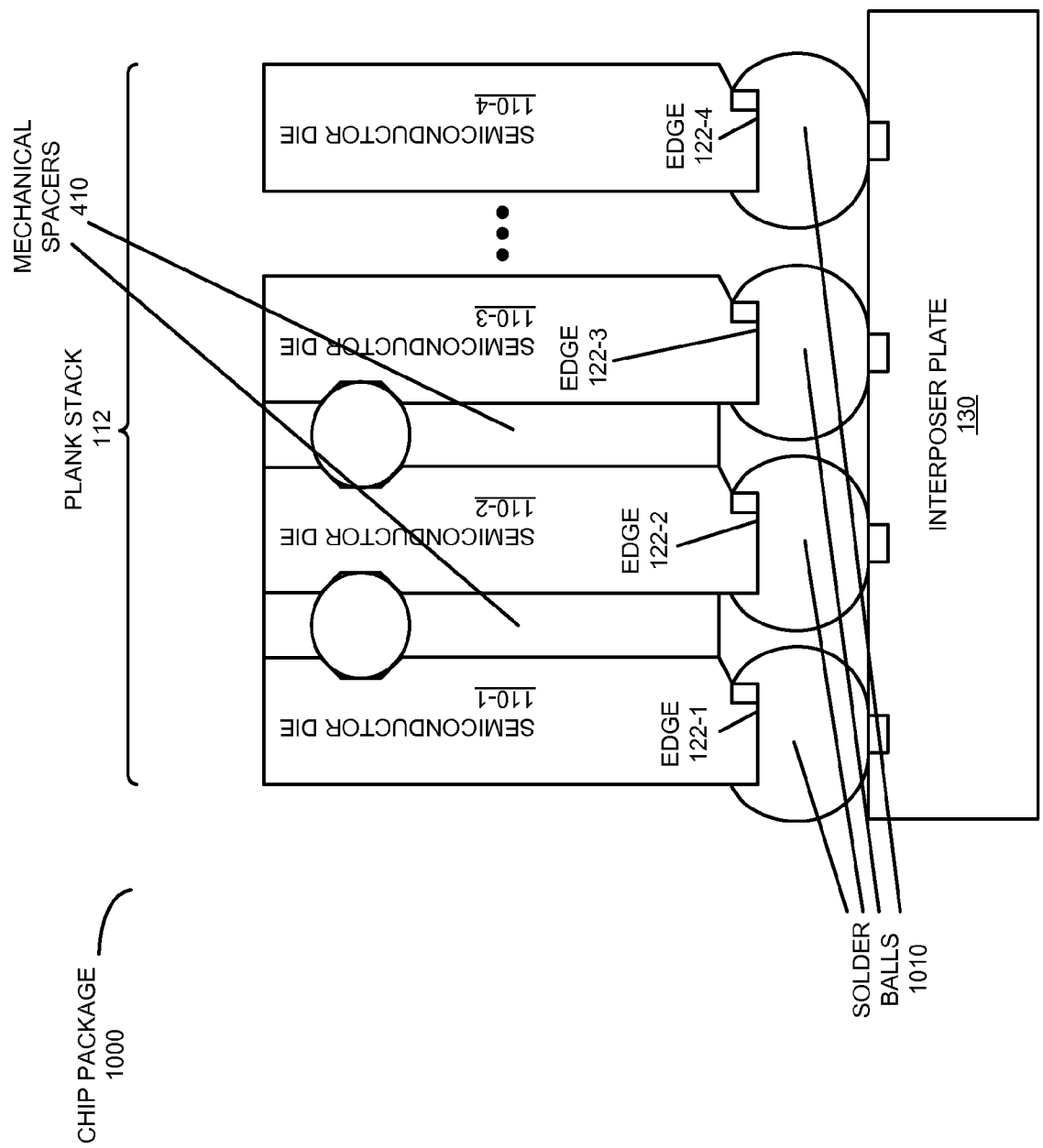
FIG. 10 is a block diagram illustrating a side view of a chip package in accordance with an embodiment of the present disclosure.

Another configuration of the chip package is shown in FIG. 10, which presents a block diagram illustrating a side view of a chip package 1000. In this configuration, edge connectors as well as chip stacking may be achieved without using negative features 144 (FIGS. 1-5), such as etch pits. Instead, semiconductor dies 110 may only include electrical connections 216 (FIGS. 2-3B) into the dicing lane, and dicing through these traces may create the edge connectors. Semiconductor dies fabricated in this manner may be stacked using non-conductive adhesive layers or, as described previously, mechanical spacers in conjunction with a mechanical-alignment plate and mechanical-alignment components.

Furthermore, plank stack 112 may be aligned to interposer plate 130 that has solder balls 1010 attached to electrical pads 132 (FIG. 1). Plank stack 112 with the exposed edge connectors may be aligned with this array of solder balls 1010 and, during reflow, electrical and mechanical coupling may occur by solder wicking up the appropriate exposed traces or electrical pads 120 (FIG. 1) on the surfaces of semiconductor dies 110. Thus, after assembly, edges of semiconductor dies 110 may be inserted into and surrounded by solder balls 1010.

Figure 11:
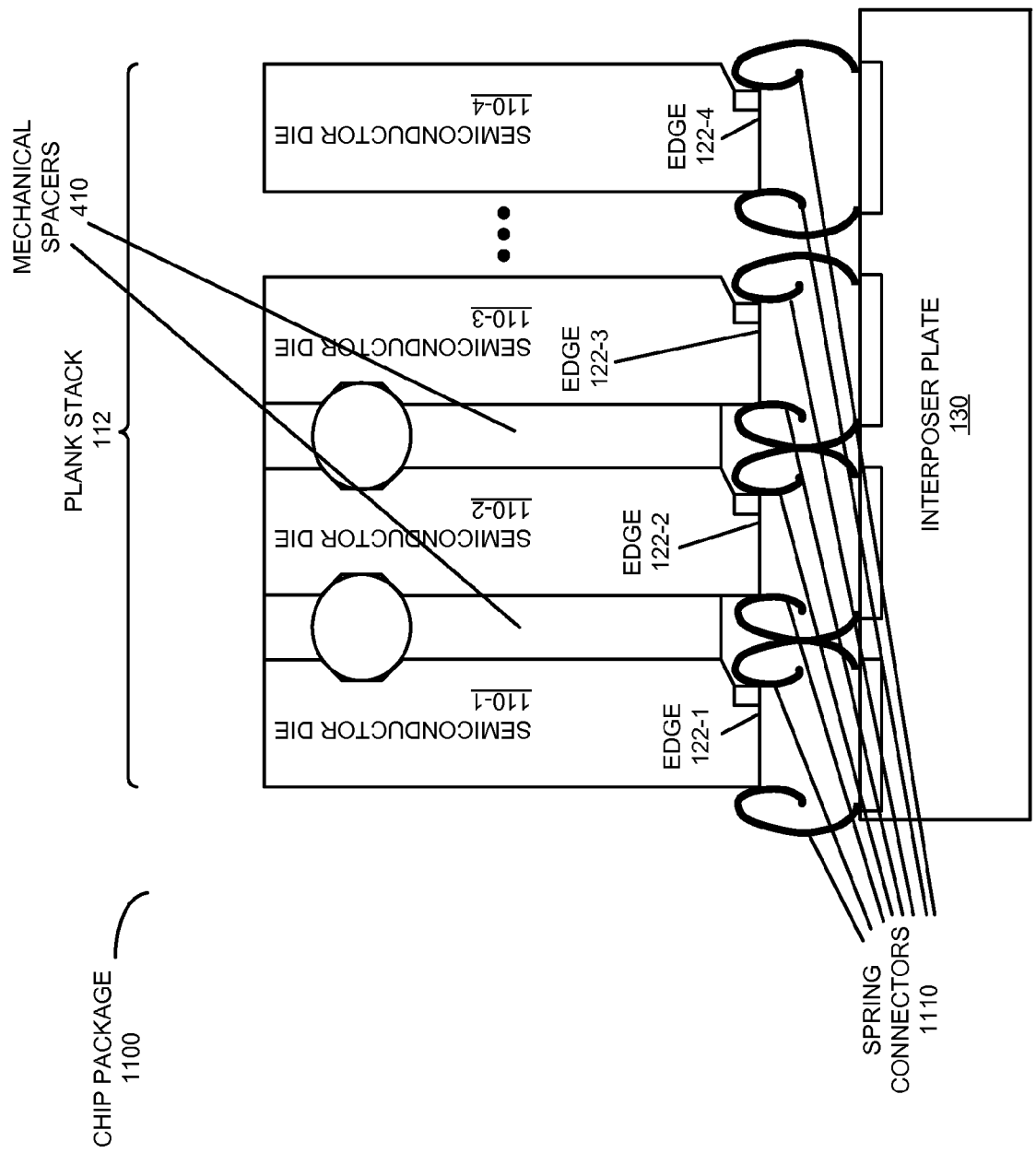
FIG. 11 is a block diagram illustrating a side view of a chip package in accordance with an embodiment of the present disclosure.

Alternatively, in some embodiments solder balls 1010 may be replaced by mechanically compliant electrical connectors, such as an array of spring connectors or coiled springs. Note that surfaces of a given semiconductor die may be positioned between and mechanically coupled to at least a pair of spring connectors in the spring array (e.g., the given semiconductor die may be aligned and inserted between the pair of spring connectors). This is shown in FIG. 11, which presents a block diagram illustrating a side view of a chip package 1100 that includes spring connectors 1110. For example, as described previously, a coiled spring may be fabricated using stress-engineered metal interconnects. These spring connectors may be designed such that an anchor of a given spring connector is at the center of this spring connector. When released, the two loose ends of the stressed metal strip may curl up to yield a spring connector with two coils. As is known to one of skill in the art, the design of spring connectors 1110, such as the coil diameter, the spring constant, the lift height, etc., may be modified as needed. Note that spring connectors 1110 can provide remateable electrical and mechanical coupling between interposer plate 130 and a large number of semiconductor dies 110.

In an exemplary embodiment, the chip package may facilitate high-performance devices, such as a dual in-line memory module. For example, there may be up to 80 memory devices (such as dynamic random-access memory or another type of memory-storage device) in the chip package. If needed, 'bad' or faulty memory devices can be disabled. Thus, 72 memory devices (out of 80) may be used. Furthermore, this configuration may expose the full bandwidth of the memory devices in the memory module, such that there is little or no latency delay in accessing any of the memory devices.

Alternatively, the dual in-line memory module may include multiple fields that each can include a chip package. For example, there may be four chip packages (each of which includes nine memory devices) in a dual in-line memory module.

In some embodiments, one or more of these dual in-line memory modules (which can include one or more chip packages) may be coupled to a processor, thereby bringing a high-chip-count memory stack closer to the processor. For example, the processor may be electrically coupled, via the interposer plate, to one or more adjacent dual in-line memory modules. Alternatively, the one or more dual in-line memory modules may be electrically coupled to the processor, which, in turn, may be mounted on an interposer plate using C4 solder balls. Thus, the chip package may provide a low-latency and low-power link to the high-capacity memory.

Figure 12:
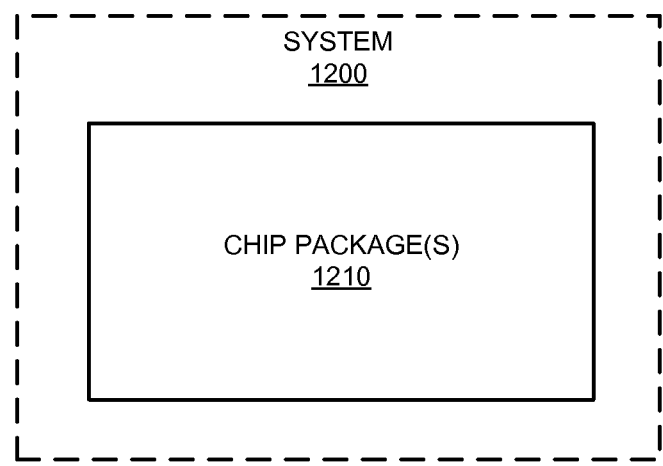
FIG. 12 is a block diagram illustrating a system that includes one or more of the chip packages of FIGS. 1, 4-5 and 9-11 in accordance with an embodiment of the present disclosure.

We now describe embodiments of the system (such as an electronic device and/or a computer system). FIG. 12 presents a block diagram illustrating a system 1200 that includes one or more chip package(s) 1210, such as one or more of the chip packages of FIGS. 1, 4-5 and 9-11. System 1200 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, and/or another electronic computing device. Note that a given computer system may be at one location or may be distributed over multiple, geographically dispersed locations.

The preceding embodiments of the chip package, as well as system 1200, may include fewer components or additional components. For example, in some embodiments there may be encapsulation around at least a portion of the chip package. Alternatively or additionally, referring back to FIG. 5, there may be optional fins or mechanical-alignment components 512 in negative features along edges 122. These optional mechanical-alignment components may be positioned into corresponding negative features in interposer plate 130, thereby aligning components in the chip package and providing the appropriate spacing between semiconductor dies 110. In this way, positive features 128 may be supplemented or obviated.

Moreover, although these chip packages and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. In addition, functionality in the preceding embodiments may be implemented more in hardware and less in software, or less in hardware and more in software, as is known in the art.

While the preceding embodiments illustrate particular configurations of the chip package, a number of techniques and configurations may be used to implement mechanical alignment of components. In particular, alignment and assembly of the semiconductor dies in the plank stack may be facilitated by positive and/or negative features that may be separated from or included on the semiconductor dies. In general, positive features (which protrude or extend above a surrounding region) that are included on the semiconductor dies may be photolithographically defined using an additive (i.e., a material-deposition) and/or a subtractive (i.e., a material-removal) process. These positive features may include: hemispheres, bumps or top-hat shapes, ridges, pyramids, and/or truncated pyramids. Moreover, positive features on a first semiconductor die may mate with or couple to negative features (which are positioned below or recessed relative to a surrounding region) on a second semiconductor die. Note that the negative features may also be photolithographically defined using an additive (i.e., a material-deposition) and/or a subtractive (i.e., a material-removal) process. Furthermore, in some embodiments positive and/or negative features on the semiconductor dies (such as an etch pit or slot) may be used in combination with micro-spheres or balls. This alignment technique can be implemented in a wafer-scale process, thereby facilitating simpler and lower-cost assembly of chip modules.

Moreover, while the preceding embodiments use semiconductor dies (such as silicon) in the chip package, in other embodiments a different material than a semiconductor may be used as the substrate material in one or more of the chips. However, in embodiments in which silicon is used, the semiconductor dies may be fabricated using standard silicon processing. These semiconductor dies may provide a silicon area that supports logic and/or memory functionality.

Furthermore, referring back to FIG. 1, in some embodiments interposer plate 130 is a passive component, such as a plastic interposer plate with metal traces to electrically couple to semiconductor dies 110. For example, interposer plate 130 may be fabricated using injection-molded plastic. Alternatively, interposer plate 130 may be another semiconductor die with one or more lithographically defined wires, and/or signal lines. In embodiments where interposer plate 130 includes a semiconductor die, active devices, such as limit amplifiers, may be included to reduce crosstalk between the signal lines. Additionally, crosstalk may be reduced in either an active or a passive interposer plate 130 using differential signaling.

In some embodiments, interposer plate 130 includes transistors and wires that shuttle data and power signals among semiconductor dies 110 via intervening conductive material 136. For example, interposer plate 130 may include high-voltage signals. These signals may be stepped down for use on semiconductor dies 110 using: a step-down regulator (such as a capacitor-to-capacitor step-down regulator), as well as capacitor and/or inductor discrete components to couple to semiconductor dies 110.

Additionally, interposer plate 130 may include a buffer or logic chip for memory, and/or I/O connectors to external device(s) and/or system(s). For example, the I/O connectors may include one or more: ball bonds, wire bonds, and/or edge connectors for coupling to external devices. In some embodiments, these I/O connectors may be on a back side of interposer plate 130, and interposer plate 130 may include one or more TSVs that couple the I/O connectors to additional connectors near semiconductor dies 110, such as solder pads.

In some embodiments, interposer plate 130 and semiconductor dies 110 in one or more embodiments of the chip package are mounted on an optional substrate (such as a printed circuit board or a semiconductor die). This optional substrate may include: ball bonds, wire bonds, edge connectors, solder bumps (such as C4), spring connectors, and/or socket connectors for coupling to external devices. If these I/O connectors are on a back side of the optional substrate, the optional substrate may include one or more TSVs.

Furthermore, in some embodiments heat can be removed from plank stack 112 using an optional heat sink (not shown), which may interface with one or more sides or faces of plank stack 112 (and which are different than the faces electrically coupled to interposer plate 130 and/or mechanical-alignment plate 138). Alternatively, mechanical-alignment plate 138 may remove heat from plank stack 112 (i.e., it may also be a heat sink). The heat sink may include 'fins,' which may provide mechanical stability and may also help remove heat without interfering with the alignment between semiconductor dies 110. This may be accomplished by placing the fins in the positive features. For example, the fins may provide a lattice structure that is positioned over the spherical balls, but which does not control or interfere with the micron-level positioning of the spherical balls. In some embodiments, the fins may have a slotted structure (as opposed to a lattice structure). In these embodiments, the fins extending from mechanical plate 138 may have slots such that when mechanical plate 138 is mated with plank stack 112 (in which semiconductor dies 110 are already aligned using positive features, such as spherical balls), then the positive features between the semiconductor dies may pass through a gap or a slot in each fin. Thus, plank stack 112 may be aligned using positive and negative features as described previously, but there may also be fins (with slots so as not to displace the alignment features) extending from mechanical plate 138 in between semiconductor dies 110 in plank stack 112.

Additionally, in some embodiments mechanical spacers 410 (FIG. 4) may include a heat-spreading material (and, more generally, an intermediate material between semiconductor dies 110 that has a high thermal conductivity), which may help remove heat generated during operation of circuits on one or more semiconductor dies 110 and/or interposer plate 130. This thermal management may include any of the following thermal paths: a first thermal path in the plane of semiconductor dies 110; a second thermal path in the plane of mechanical spacers 410 (FIG. 4); and/or a third thermal path in the plane of the heat-spreading material. Note that this thermal management may include the use of: phase change cooling, immersion cooling, and/or a cold plate.

In contrast with existing stacked semiconductor dies, in the present disclosure heat may be extracted from the edges of semiconductor dies 110 (as opposed to from the face of the semiconductor die at the end of the stack). Moreover, because of the approximately perpendicular orientation between semiconductor dies 110 and this optional heat sink, a thermal path (and, thus, unobstructed heat flow) between these components may be maintained along x direction 114 so that the maximum temperature of a given semiconductor die may be constant for all semiconductor dies 110 in plank stack 112 (i.e., the maximum temperature may be independent of the location of the given semiconductor die in plank stack 112). (Note that this uniform thermal management independent of the location in the plank stack is in contrast with existing 3D stacks of semiconductor dies, in which the maximum temperature of the semiconductor dies increases with distance from the heat sink at the end of the existing 3D stack.) Furthermore, because the temperature is independent of location and the number of semiconductor dies 110 in plank stack 112, chip package 100 may include more semiconductor dies 110 in plank stack 112 than chip packages that include TSVs.

In general, thickness 412 (FIG. 4) of semiconductor dies 110 may represent a tradeoff between the density of a given footprint (which favors a larger number of semiconductor dies and, thus, thinner semiconductor dies) and the thermal resistance (which favors thicker semiconductor dies).

While FIG. 1 illustrates chip package 100 in which semiconductor dies 110 have a common orientation (so that active electronics proximate to surfaces of semiconductor dies 110 are on a common side of semiconductor dies 110), in other embodiments (not shown) an alternating or periodic orientation is used (so that the active electronics proximate to surfaces of the pairs of adjacent semiconductor dies 110 face each other).

In some embodiments, more than one edge of a given semiconductor die can be used for electrical-pad placement and to interface with an interposer plate, which may allow more routing area and may improve the electrical performance of chip package 100.

Moreover, note that embodiments which involve soldering to gold stud bumps may involve additional processing operations to add barrier layers to prevent intermetallic formation. In particular, additional barrier layers, such as nickel/gold or nickel/palladium/gold metal stacks, may be deposited on the entire stud-bump surface using an electroless plating technique at either the wafer or die level. Similarly, embodiments that involve dicing through the stud bumps and/or bump pads may include processing operations to protect the bumps pads, such as depositing the additional barrier layers on the entire stud-bump surfaces.

Figure 13:
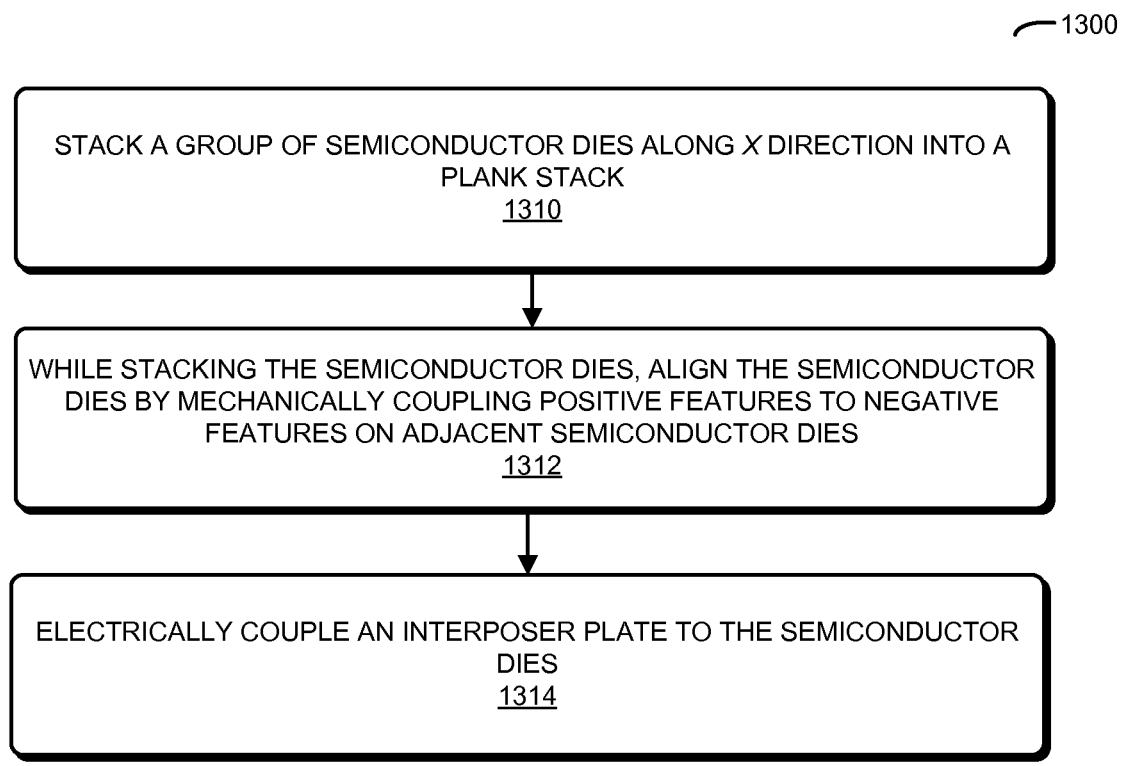
FIG. 13 is a flow diagram illustrating a method for fabricating a plank stack of semiconductor dies in the chip packages of FIGS. 1, 4-5 and 9-11 in accordance with an embodiment of the present disclosure.

We now describe embodiments of the method. FIG. 13 presents a flow diagram illustrating a method for fabricating a plank stack of semiconductor dies in the chip packages of FIGS. 1, 4-5 and 9-11. During this method, the semiconductor dies are stacked along the x direction into a plank stack (operation 1310), where the plane of the given semiconductor die is defined by the z direction and the y direction, where the z direction, the x direction and the y direction are substantially perpendicular to each other. Note that the semiconductor dies include the first electrical pads proximate to edges of the semiconductor dies, and the edges of the semiconductor dies define the face of the plank stack. Moreover, the surfaces of the semiconductor dies may include negative features recessed below the surfaces. While stacking the semiconductor dies, the semiconductor dies in the plank stack are aligned by mechanically coupling positive features to the negative features on adjacent semiconductor dies (operation 1312). Furthermore, the interposer plate may be electrically coupled to the semiconductor dies along the x direction (operation 1314), where the plane of the interposer plate is defined by the x direction and the y direction. The electrical coupling to the semiconductor dies may be between the first electrical pads, second electrical pads proximate to the surface of the interposer plate along the x direction, and the intervening conductive material between the first electrical pads and the second electrical pads.

Note that the stacking may occur before the semiconductor dies are diced from their associated wafers. Thus, wafer-level or die-level stacking may be used during the method.

In some embodiments of method 1300 there may be additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
   a group of semiconductor dies arranged in a plank stack in an x direction, wherein a plane of a given semiconductor die is defined by a z direction and a y direction, wherein the semiconductor dies include first electrical pads proximate to edges of the semiconductor dies, wherein the edges of the semiconductor dies define a face of the plank stack, wherein surfaces of the semiconductor dies are defined by the z direction and the y direction, and wherein the surfaces of the semiconductor dies include negative features recessed below the surfaces;
   positive features mechanically coupled to the negative features on adjacent semiconductor dies, thereby aligning the semiconductor dies in the plank stack; and
   an interposer plate electrically coupled to the semiconductor dies along the x direction, wherein a plane of the interposer plate is defined by the x direction and the y direction;
   wherein the electrical coupling to the semiconductor dies is between the first electrical pads, second electrical pads proximate to a surface of the interposer plate along the x direction, and an intervening conductive material between the first electrical pads and the second electrical pads.

2. The chip package of claim 1, wherein a first electrical pad on a given semiconductor die is included in a second negative feature recessed below one of the surfaces of the given semiconductor die.

3. The chip package of claim 2, wherein the second negative feature is included in a dicing lane of the given semiconductor die.

4. The chip package of claim 1, wherein the intervening conductive material includes solder balls.

5. The chip package of claim 4, wherein the edges of the semiconductor dies are surrounded by the solder balls.

6. The chip package of claim 1, wherein the intervening conductive material includes mechanically compliant electrical connectors.

7. The chip package of claim 6, wherein the mechanically compliant electrical connectors include an array of spring connectors.

8. The chip package of claim 7, wherein surfaces of a given semiconductor die are positioned between and mechanically coupled to at least a pair of spring connectors in the array of spring connectors.

9. The chip package of claim 1, wherein a first electrical pad on a given semiconductor die is electrically coupled to an additional pad on the given semiconductor die by an electrical signal line.

10. The chip package of claim 1, further comprising:
    a mechanical-alignment plate; and
    mechanical-alignment components, wherein the plank stack is mechanically coupled to the mechanical-alignment plate by the mechanical-alignment components, thereby facilitating alignment of the semiconductor dies in the plank stack; and
    wherein the mechanical-alignment plate is mechanically coupled to the plank stack on an opposite face of the plank stack from the interposer plate.

11. The chip package of claim 10, wherein the mechanical-alignment components include at least one of: spheres, clamps and pins.

12. The chip package of claim 1, wherein the semiconductor dies include third electrical pads proximate to the edges of the semiconductor dies along the y direction;
    wherein the interposer plate is further electrically coupled to the semiconductor dies along the y direction; and
    wherein the electrical coupling to the semiconductor dies is between the third electrical pads, fourth electrical pads proximate to the surface of the interposer plate along the y direction, and the intervening conductive material between the third electrical pads and the fourth electrical pads.

13. The chip package of claim 1, wherein the second electrical pads include one of: discrete pads and a continuous electrical signal line on the interposer plate.

14. The chip package of claim 1, further comprising mechanical-alignment components mechanically coupled to the edges of the semiconductor dies and the interposer plate.

15. The chip package of claim 1, wherein the semiconductor dies are mechanically coupled by adhesive layers in spaces between the semiconductor dies; and
    wherein the adhesive layers are recessed from the first electrical pads in the spaces between pairs of semiconductor dies.

16. A system, comprising a chip package, wherein the chip package includes:
    a processor;
    a memory;
    wherein the memory comprises a group of semiconductor dies arranged in a plank stack in an x direction, wherein a plane of a given semiconductor die is defined by a z direction and a y direction, wherein the semiconductor dies include first electrical pads proximate to edges of the semiconductor dies, wherein the edges of the semiconductor dies define a face of the plank stack, wherein surfaces of the semiconductor dies are defined by the z direction and the y direction, and wherein the surfaces of the semiconductor dies include negative features recessed below the surfaces;
    positive features mechanically coupled to the negative features on adjacent semiconductor dies, thereby aligning the semiconductor dies in the plank stack; and an interposer plate electrically coupled to the semiconductor dies along the x direction, wherein a plane of the interposer plate is defined by the x direction and the y direction;

wherein the electrical coupling to the semiconductor dies is between the first electrical pads, second electrical pads proximate to a surface of the interposer plate along the x direction, and an intervening conductive material between the first electrical pads and the second electrical pads.

17. The system of claim 16, wherein a first electrical pad on a given semiconductor die is included in the second negative feature recessed below one of the surfaces of the given semiconductor die.

18. The system of claim 17, wherein the other negative feature is included in a dicing lane of the given semiconductor die.

19. The system of claim 16, further comprising:
a mechanical-alignment plate; and
mechanical-alignment components, wherein the plank stack is mechanically coupled to the mechanical-alignment plate by the mechanical-alignment components, thereby facilitating alignment of the semiconductor dies in the plank stack; and
wherein the mechanical-alignment plate is mechanically coupled to the plank stack on an opposite face of the plank stack from the interposer plate.

20. A method for fabricating a plank stack of semiconductor dies in an x direction, wherein the method comprises:
stacking the semiconductor dies along the x direction into the plank stack, wherein a plane of a given semiconductor die is defined by a z direction and a y direction, wherein the semiconductor dies include first electrical pads proximate to edges of the semiconductor dies, wherein the edges of the semiconductor dies define a face of the plank stack, wherein surfaces of the semiconductor dies are defined by the z direction and the y direction, and wherein the surfaces of the semiconductor dies include negative features recessed below the surfaces;
while stacking the semiconductor dies, aligning the semiconductor dies in the plank stack by mechanically coupling positive features to the negative features on adjacent semiconductor dies; and
electrically coupling an interposer plate to the semiconductor dies along the x direction, wherein a plane of the interposer plate is defined by the x direction and the y direction;
wherein the electrical coupling to the semiconductor dies is between the first electrical pads, second electrical pads proximate to a surface of the interposer plate along the x direction, and an intervening conductive material between the first electrical pads and the second electrical pads.

* * * * *